(12) United States Patent
Hong et al.

(10) Patent No.: US 12,372,558 B2
(45) Date of Patent: Jul. 29, 2025

(54) DEVICE AND METHOD FOR MEASURING VOLTAGE BY USING OPTICAL ELEMENT

(71) Applicants: AGENCY FOR DEFENSE DEVELOPMENT, Daejeon (KR); KOREA ADVANCED INSTITUTE OF SCIENCE AND TECHNOLOGY, Daejeon (KR)

(72) Inventors: Sunghoon Hong, Daejeon (KR); Hyun Jong Woo, Daejeon (KR); Youngchul Ghim, Daejeon (KR); Seongmin Choi, Daejeon (KR); Donggeun Lee, Daejeon (KR); Alvin Amry Sugianto, Daejeon (KR)

(73) Assignees: AGENCY FOR DEFENSE DEVELOPMENT, Daejeon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 85 days.

(21) Appl. No.: 18/038,986

(22) PCT Filed: Mar. 18, 2021

(86) PCT No.: PCT/KR2021/003346
§ 371 (c)(1),
(2) Date: May 26, 2023

(87) PCT Pub. No.: WO2022/114402
PCT Pub. Date: Jun. 2, 2022

(65) Prior Publication Data
US 2023/0417804 A1  Dec. 28, 2023

(30) Foreign Application Priority Data
Nov. 27, 2020  (KR) ........................ 10-2020-0163259

(51) Int. Cl.
*G01R 15/24* (2006.01)
*G01R 19/00* (2006.01)

(52) U.S. Cl.
CPC ....... *G01R 15/242* (2013.01); *G01R 19/0084* (2013.01)

(58) Field of Classification Search
CPC ...... G01R 15/242; G01R 1/071; G01R 15/24; G01R 15/241; G01R 29/14; G01R 15/246;
(Continued)

(56) References Cited

U.S. PATENT DOCUMENTS

| | | | | |
|---|---|---|---|---|
| 4,531,092 A | * | 7/1985 | Shibano | G01R 33/0322 324/96 |
| 5,085,713 A | | 2/1992 | Morishita et al. | |

(Continued)

FOREIGN PATENT DOCUMENTS

| | | |
|---|---|---|
| JP | 103249567 | 11/1991 |
| JP | H06160437 | 6/1994 |

(Continued)

OTHER PUBLICATIONS

Office Action of Japan Counterpart Application, with English translation thereof, issued on Apr. 2, 2024, pp. 1-7.
(Continued)

*Primary Examiner* — Vinh P Nguyen
(74) *Attorney, Agent, or Firm* — JCIPRNET

(57) ABSTRACT

A voltage measuring device for measuring a voltage by using a Pockels cell includes a Pockels cell changing a refractive index of incident light based on an applied electric field, at least one non-polarized beam splitter splitting an incident beam, a first polarizing plate polarizing a first beam split by the at least one non-polarized beam splitter, a first light detector detecting light polarized based on the first polarizing plate, a ¼ wave plate elliptically polarizing and outputting a second beam split by the at least one non-polarized beam splitter, a second polarizing plate polarizing the elliptically polarized second beam, a second light detector detecting light polarized based on the ¼ wave plate and the second polarizing plate, and a controller configured to measure a voltage based on a first light intensity determined by the first light detector and a second light intensity determined by the second light detector.

17 Claims, 10 Drawing Sheets

(58) Field of Classification Search
CPC ............ G01R 33/0322; G01R 29/0885; G01R 13/347; G01R 29/24; G01R 29/08; G01R 15/245; G01R 19/155; G01R 19/0084; G01R 19/0092; G01R 19/2513; G01R 33/26; G01R 31/2653; H01S 3/005; H01S 3/0941; H01S 3/107; H01S 3/10061; G01N 21/21; G02B 21/0032; G02B 27/48; G02B 26/101; G02B 21/0056; G02B 27/283; G02B 21/0068; G02B 5/3025; G02B 21/0048; G02B 26/08; G02B 26/0833; G02B 26/085; G02B 6/126

See application file for complete search history.

(56) References Cited

U.S. PATENT DOCUMENTS

| | | | | |
|---|---|---|---|---|
| 5,134,361 | A * | 7/1992 | Pillow | G01R 15/242 |
| | | | | 359/247 |
| 5,477,134 | A * | 12/1995 | Hamada | G01R 15/242 |
| | | | | 324/96 |
| 5,801,830 | A * | 9/1998 | Seago | G01J 3/18 |
| | | | | 356/73.1 |
| 6,388,434 | B1 * | 5/2002 | Davidson | G01R 15/24 |
| | | | | 250/227.17 |
| 8,233,754 | B2 * | 7/2012 | Bohnert | G01R 15/242 |
| | | | | 385/12 |
| 2006/0274795 | A1 | 12/2006 | Sekita et al. | |
| 2016/0356823 | A1 | 12/2016 | Gu et al. | |

FOREIGN PATENT DOCUMENTS

| | | |
|---|---|---|
| JP | H06207954 | 7/1994 |
| JP | H09292415 | 11/1997 |
| JP | H1066247 | 3/1998 |
| KR | 1019900001963 | 2/1990 |
| KR | 100201022 | 6/1999 |
| KR | 1020040054087 | 6/2004 |
| KR | 1020060005199 | 1/2006 |
| KR | 1020060005200 | 1/2006 |
| KR | 1020080074095 | 8/2008 |
| KR | 101259638 | 4/2013 |
| KR | 1020170141148 | 12/2017 |
| WO | 2007041002 | 4/2007 |

OTHER PUBLICATIONS

"Office Action of Korea Counterpart Application", issued on Feb. 25, 2021, with English translation thereof, p. 1-p. 9.

S. Choi et al., "Polar-coordinate-based data analysis scheme for high-voltage measurement system using the Pockels electro-optic effect," Journal of Instrumentation, vol. 15, Mar. 2020, pp. 1-11.

* cited by examiner

DEVICE AND METHOD FOR MEASURING VOLTAGE BY USING OPTICAL ELEMENT

TECHNICAL FIELD

The present disclosure generally relates to a method of measuring a voltage, and more particularly, to a device and method for measuring a voltage by using an optical element.

BACKGROUND ART

Existing voltage measuring devices use a converter and a transformer for voltage measurement, consisting of an iron core and a winding core. Voltage measuring devices including an iron core and a winding core have a large size and are vulnerable to noise. To overcome this, methods of measuring high voltage and high current by using a laser beam have been developed. High voltage measuring devices using a laser beam use a sensor including an insulating material and may exclude effects of an electromagnetic field. Moreover, as the high potential of a primary circuit is not output to a secondary circuit, reliability may be improved, and the measurement may also be performed in a wide range of frequency domain up to high frequency of several GHz as well as direct current.

In a method of measuring a voltage using a laser, an optic-based voltage sensor using a laser and a Pockels element, which is an electro-optic element was suggested. The Pockels effect refers to an effect in which when a voltage is applied to a particular crystal, a polarization state of light passing through the crystal changes. A voltage measuring system measuring a voltage based on a degree of polarization state change of light passing through a Pockels cell was suggested.

However, such voltage measuring methods using a Pockels cell have two major disadvantages. First, the existing voltage measuring methods lack a method for compensating for unstable alignment of a Pockels cell and a laser irradiated to the Pockels cell. As aligning the laser, the Pockels cell, and an optical system perfectly is technically difficult, and Lissajous' figure by sin and cos signals received by a light detector is distorted, measured voltage signals may be distorted. Next, there may be an error in voltage measurement caused by unstable laser power during operation of a voltage sensor.

DISCLOSURE

Technical Problem

Based on the foregoing background, provided are a method and device for measuring a voltage by using an optical element.

The present disclosure provides a device and method for improving performance of an optic-based voltage measuring device using a Pockels cell, by compensating for instability of laser power.

The present disclosure also provides a device and method for improving performance of an optic-based voltage measuring device using a Pockels cell, by compensating for alignment of a laser and the Pockels cell.

The present disclosure also provides a device and method for improving performance of an optic-based voltage measuring device using a Pockels cell, by compensating for transmittance error of a laser and the Pockels cell.

The present disclosure also provides a device and method for improving performance of an optic-based voltage measuring device using a Pockels cell, by compensating for transmittance error.

The present disclosure also provides a device and method for expanding a measurable range of voltage through light intensity analysis.

Technical Solution

According to various embodiments of the present disclosure, a voltage measuring device for measuring a voltage by using a Pockels cell includes: a Pockels cell changing a refractive index of incident light based on an applied electric field; at least one non-polarized beam splitter splitting an incident beam; a first polarizing plate polarizing a first beam split by the at least one non-polarized beam splitter; a first light detector detecting light polarized based on the first polarizing plate; a ¼ wave plate elliptically polarizing and outputting a second beam split by the at least one non-polarized beam splitter; a second polarizing plate polarizing the elliptically polarized second beam; a second light detector detecting light polarized based on the ¼ wave plate and the second polarizing plate; and a controller configured to measure a voltage based on a first light intensity determined by the first light detector and a second light intensity determined by the second light detector.

According to another embodiment, the controller included in the voltage measuring device may determine a first relation indicating a relationship between the first light intensity and a phase difference and a second relation indicating a relationship between the second light intensity and a phase difference, and measure a voltage based on the first relation and the second relation.

According to another embodiment, the controller included in the voltage measuring device may detect laser power fluctuation based on the first light intensity and the second intensity, determine, among fluctuation values according to the laser power fluctuation, a light intensity corresponding to a light intensity according to the first relation and a light intensity according to the second relation, determine a Pockels cell voltage based on the determined light intensity, and measure a voltage based on the Pockels cell voltage.

According to another embodiment, the controller included in the voltage measuring device may determine an alignment error in relation to a polarization axis of a laser and a polarization axis of the Pockels cell, determine a Pockels cell voltage based on a relation considering the alignment error and indicating a relationship between the first light intensity and a phase difference and a relation considering the alignment error and indicating a relationship between the second light intensity and a phase difference, and measure a voltage based on the Pockels cell voltage.

According to another embodiment, the controller included in the voltage measuring device may determine a ratio between a vertical polarization transmittance and a horizontal polarization transmittance of the non-polarized beam splitter, determine a Pockels cell voltage based on a relation considering the transmittance ratio and indicating a relationship between the first light intensity and a phase difference and a relation considering the transmittance ratio and indicating a relationship between the second light intensity and a phase difference, and measure a voltage based on the Pockels cell voltage.

According to another embodiment, the controller included in the voltage measuring device may determine a ratio between a vertical polarization transmittance and a horizontal polarization transmittance at the non-polarized beam splitter, determine a Pockels cell voltage based on a relation considering the alignment error and the transmittance ratio and indicating a relationship between the first light intensity and a phase difference and a relation considering the alignment error and the transmittance ratio and indicating a relationship between the second light intensity and a phase difference, and measure a voltage based on the Pockels cell voltage.

According to another embodiment, the first light detector may measure first light intensities over multiple times, the second light detector may measure second light intensities over multiple times, and the alignment error and the transmittance ratio may be determined based on statistical values of the first light intensities and the second light intensities.

According to another embodiment, when a voltage changes over time, the controller may control a measuring range of the voltage to be greater than a half-wavelength voltage range of the Pockels cell, based on a time-tracking method.

According to an embodiment of the present disclosure, a method of operating a Pockels cell-based voltage measuring device measuring a voltage based on an intensity of light passing through a Pockels cell includes: determining a first relation indicating a relationship between a first light intensity and a phase difference and a second relation indicating a relationship between a second light intensity and a phase difference; and measuring a voltage based on the first relation and the second relation, wherein the first light intensity indicates an intensity of light which has passed through the Pockels cell and has been polarized based on a first polarizing plate, and detected by a first light detector, and the second light intensity indicates an intensity of light which has passed through the Pockels cell and has been polarized based on a second polarizing plate and a ¼ wave plate, and detected by a second light detector.

According to another embodiment, the measuring of a voltage includes: detecting laser power fluctuation based on the first light intensity and the second intensity; determining, among fluctuation values according to the laser power fluctuation, a light intensity corresponding to a light intensity according to the first relation and a light intensity according to the second relation; determining a Pockels cell voltage based on the determined light intensity; and measuring a voltage based on the Pockels cell voltage.

According to another embodiment, the measuring of a voltage includes: determining an alignment error in relation to a polarization axis of a laser and a polarization axis of the Pockels cell; determining a Pockels cell voltage based on a relation considering the alignment error and indicating a relationship between the first light intensity and a phase difference and a relation considering the alignment error and indicating a relationship between the second light intensity and a phase difference; and measuring a voltage based on the Pockels cell voltage.

According to another embodiment, the measuring of a voltage includes: determining a ratio between a vertical polarization transmittance and a horizontal polarization transmittance of a non-polarized beam splitter; determining a Pockels cell voltage based on a relation considering the transmittance ratio and indicating a relationship between the first light intensity and a phase difference and a relation considering the transmittance ratio and indicating a relationship between the second light intensity and a phase difference; and measuring a voltage based on the Pockels cell voltage.

According to another embodiment, the measuring of a voltage includes: determining a ratio between a vertical polarization transmittance and a horizontal polarization transmittance of a non-polarized beam splitter; determining a Pockels cell voltage based on a relation considering the alignment error and the transmittance ratio and indicating a relationship between the first light intensity and a phase difference and a relation considering the alignment error and the transmittance ratio and indicating a relationship between the second light intensity and a phase difference; and measuring a voltage based on the Pockels cell voltage.

Various aspects and features of the present disclosure are defined in the attached claims. Combinations of features described in dependent claims are not just suggested in the claims but may be properly combined with features of the independent claims.

In addition, one or more features selected from any one embodiment described in the present disclosure may be combined with one or more features selected from another embodiment described in the present disclosure, and such alternative combinations of features are deemed possible when they at least partially relieve one or more technical problems discussed in the present disclosure, at least partially relive technical problems discernable by a person skilled in the art from the present disclosure, and further, when particular combination or permutation of embodiments features are not understood as incompatible by a person skilled in the art.

In any example implementation described in the present disclosure, two or more physically separate components may alternatively be integrated into a single component, if possible, and the integration is deemed possible when such a single component can perform the same function. On the contrary, a single component of any embodiment described in the present disclosure may alternatively be implemented by two or more separate components that achieve the same function, when necessary.

The purpose of certain embodiment of the present disclosure is to at least partially resolve, relieve, or remove at least one of issues and/or disadvantages of related arts. Certain embodiments aim to provide at least one advantageous effects described below.

Advantageous Effects

In a device and method according to various embodiments of the present disclosure, an optic-based voltage measuring device using a Pockels cell detects and analyzes polarization changes of light according to voltage by using a light detector to reduce measurement errors of the optic-based voltage measuring device using a Pockels cell.

In addition, in a device and method according to various embodiments of the present disclosure, an optic-based voltage measuring device using a Pockels cell detects and analyzes polarization changes of light according to voltage by using a light detector to extend a voltage measurement range of the optic-based voltage measuring device using a Pockels cell.

The effects that may be achieved by the present disclosure are not limited to the foregoing, and unmentioned other effects may be clearly understood by a person skilled in the art from the descriptions below.

BEST MODE

Mode for Invention

Figure 1:
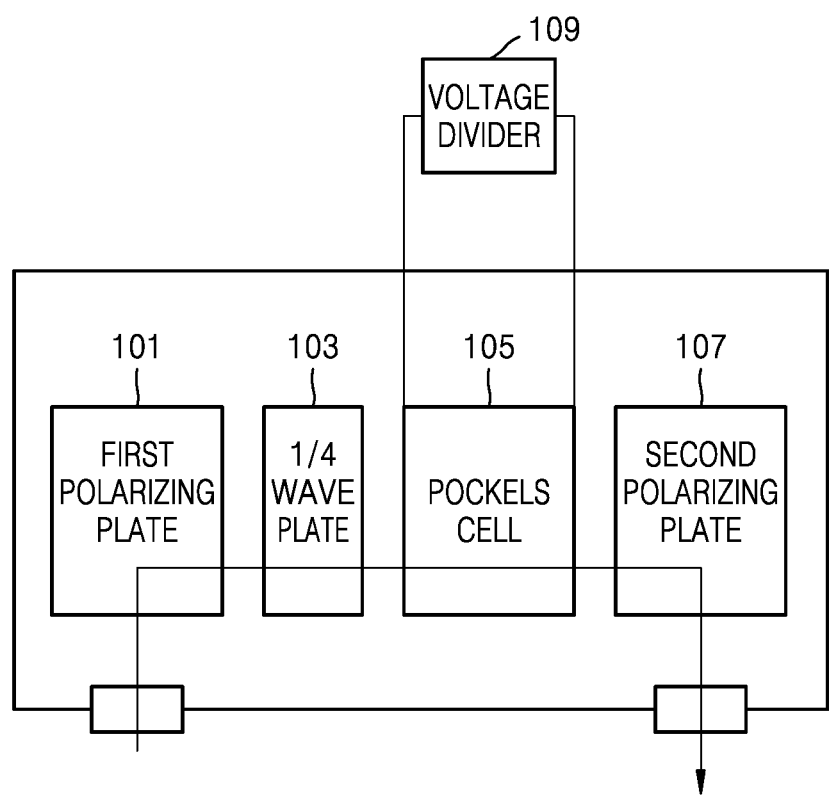
FIG. 1 is a block diagram of a voltage measuring device using a Pockels cell.

The terms used in the present disclosure are merely used to describe exemplary embodiments, and are not intended to limit the scope of other embodiments. An expression used in the singular encompasses the expression of the plural, unless it has a clearly different meaning in the context. The terms used herein, including technical or scientific terms, may have the same meaning as commonly understood by one of ordinary skill in the art. Among the terms used herein, the general terms defined by dictionaries shall be understood as having a meaning consistent with what such terms mean in the context of related technologies, and shall not be interpreted as ideal or excessively formal terms unless explicitly defined. In some cases, even the terms defined in the present disclosure are not interpreted to exclude embodiments of the present disclosure.

In various embodiments of the present disclosure described below, a hardware-wise approach may be described. However, as various embodiments of the present disclosure include technologies using both of hardware and software, the various embodiments of the present disclosure should not be construed as excluding a software-wise approach.

The present disclosure relates to a device and method for measuring a voltage using an optical element. More specifically, the present disclosure describes technologies to correct errors of voltage measured by a voltage measuring device using a Pockels cell.

Hereinafter, embodiments of the disclosure are described in detail with reference to the accompanying drawings so that the embodiments of the disclosure may be easily implemented by a person skilled in the art. Embodiments of the present disclosure may be embodied in many different forms and should not be construed as being limited to the embodiments set forth herein. In the description of embodiments, certain detailed explanations of the related art are omitted when it is deemed that they may unnecessarily obscure the essence of the present disclosure. Like reference numerals in the drawings denote like elements, and thus their description will be omitted.

Throughout the specification, when an element is described as being connected to another element, the element may be connected directly to another element, or indirectly connected to another element with an intervening element therebetween. When an element "includes" an element, another element may be further included, rather than excluding the existence of the other element, unless otherwise described.

Some embodiments may be explained by functional blocks and various processing operations. Some or all of such functional blocks may be realized by any number of hardware and/or software components configured to perform the specified functions. For example, the functional blocks of the disclosure may be implemented by one or more microprocessors or by circuit components for certain functions. Furthermore, the functional blocks of the present disclosure may be implemented with various programming or scripting languages. The functional blocks of the present disclosure may be implemented in algorithms that are executed on one or more processors. A function performed by a functional block of the present disclosure may be performed by a plurality of functional blocks, or functions performed by functional blocks of the present disclosure may be performed by a single functional block. Furthermore, embodiments could employ any number of conventional techniques for electronics configuration, signal processing and/or control, data processing and the like.

Also, in the present disclosure, to determine whether a particular condition is satisfied or fulfilled, an expression of "greater than" or "less than" is used; however, such an expression is to describe an example, and is not intended to exclude the expression of "greater than or equal to" or "less than or equal to." The expression of "greater than or equal to" may be replaced with "greater than," the expression of "less than or equal to" may be replaced with "less than," the expression of "greater than or equal to and less than" may be replaced with "greater than and less than or equal to."

FIG. 1 is a block diagram 100 of a voltage measuring device using a Pockels cell. The voltage measuring device using a Pockels cell may include a first polarizing plate 101, a ¼ wave plate 103, a Pockels cell 105, a second polarizing plate 107, and a voltage divider 109.

Incident light may be input to the first polarizing plate 101 and may be output through the ¼ wave plate 103, the Pockels cell 105, and the second polarizing plate 107.

With reference to FIG. 1, the first polarizing plate 101 may perform the function of rendering light vibrating in the vertical direction, of the input light, be incident onto the ¼ wave plate 103. Non-polarized input light may be incident onto the first polarizing plate 101, and among components travelling in a direction parallel with an electric field direction, only the components vibrating in the vertical direction may be incident onto the ¼ wave plate.

Of light vibrating along an x axis and light vibrating along a y axis, when light vibrating along an x axis is present, the ¼ wave plate 103 may phase-delay light vibrating in an x axis direction by 90°. The ¼ wave plate 103 may circularly polarize output light of the first polarizing plate to output the light to a Pockels element.

The Pockels cell 105 may include an element which, when a voltage is applied to a particular crystal, changes a polarization state of light passing through the crystal. When an electric field is applied to the Pockels element, a change may occur to components having the same refractive index, causing a difference in refractive index in each axial direction, and accordingly, the light vibrating along the x axis and the light vibrating along the y axis may have different phase delays from each other. The Pockels element may cause different phase delays to the light vibrating in the vertical direction, according to voltage to output circularly polarized light.

The second polarizing plate 107 may perform the function of filtering vertically polarized light component. The second polarizing plate 107 may filter and output vertically polarized light component from the output light of the Pockels element.

The voltage divider 109 may perform the function of applying an electric field to the Pockels element. As a difference in refractive index in each axial direction may occur when an electric field is applied to the Pockels element, the voltage divider may apply an electric field to cause a difference in refractive index of the Pockels cell.

Optic-based voltage measuring devices use the phase delay phenomenon in which, according to a change in refractive index of a Pockels element, light passing through the element is phase-delayed proportionally to a refractive index in comparison with a reference signal and measure a measurement target voltage along with the applied electric field.

Figure 2:
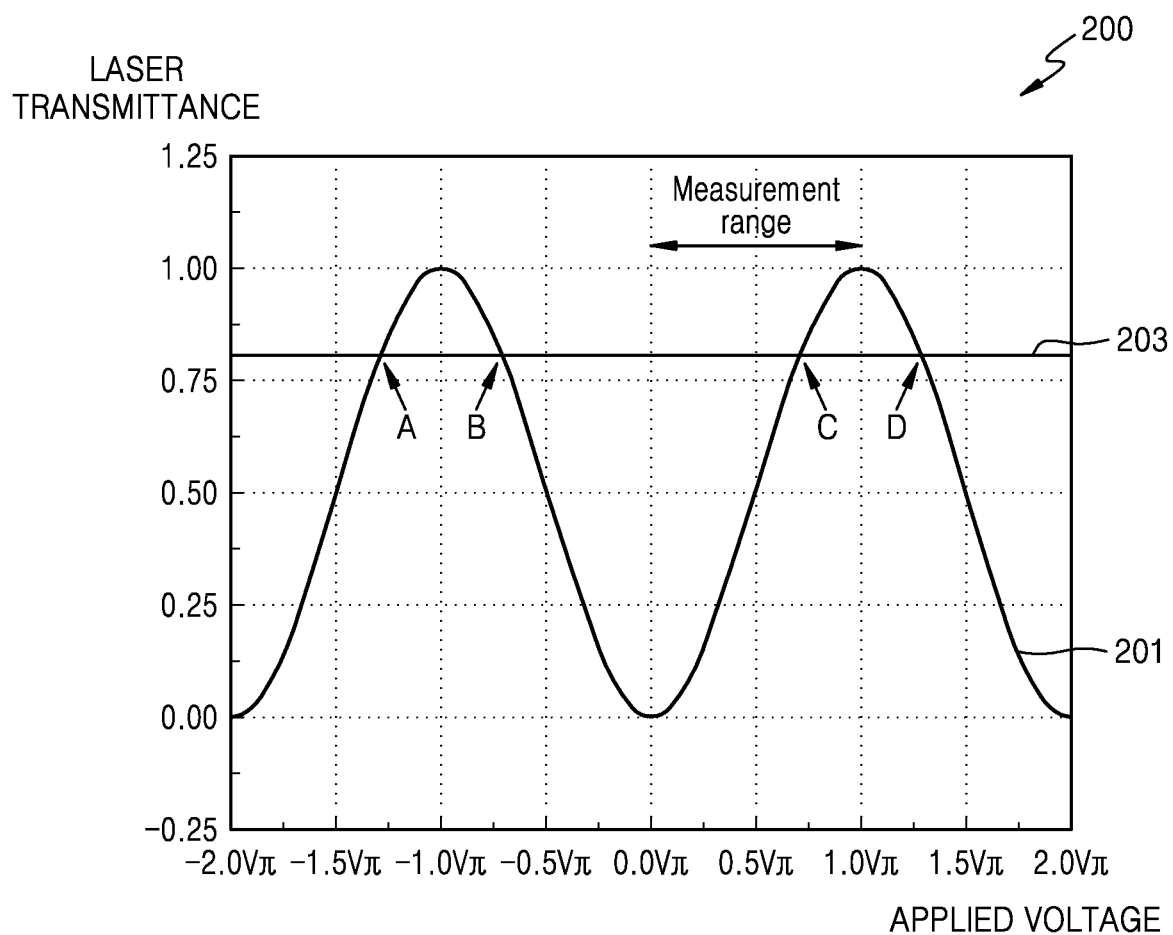
FIG. 2 is a graph showing changes in transmittance according to applied voltage in a voltage measuring device using a Pockels cell.

FIG. 2 is a graph 200 showing changes in transmittance according to applied voltage in a voltage measuring device using a Pockels cell. In FIG. 2, the horizontal axis indicates voltage applied to the Pockels cell, and the vertical axis indicates transmittance of laser.

Voltage measuring devices using a Pockels cell measure a voltage based on a transmittance ($t=I/I_0$) indicating a ratio of an intensity of output light of the laser (I) based on polarization changes of the Pockels cell according to applied voltage to an intensity of input light of the laser ($I_0$).

With reference to FIG. 2, when a voltage is applied to the Pockels cell, the transmittance according to voltage may be expressed as a graph 201 having the shape of a sinusoidal wave, and a transmittance measured by the voltage measuring device may be expressed as a linear graph 203. When a transmittance is determined by the voltage measuring device using a Pockels cell, as in the graph 203, a measurement voltage corresponding to the transmittance may have multiple values, e.g., A, B, C, D, etc. However, when the voltage measuring device that measures transmittance is used, the range of measured voltage may be limited from 0 to a half-wave voltage ($V\pi$) of the Pockels cell. Accordingly, with reference to FIG. 2, the voltage of the Pockels cell may be determined as C.

According to the voltage measuring device using a Pockels cell, when a voltage to be measured applies an electric field to the Pockels cell, the Pockels cell may cause birefringe having different refractive indexes in the x axis and the y axis. Accordingly, the intensities of the vertically polarized light and horizontally polarized light of a laser beam passing through the Pockels cell may be different from each other. The refractive index changed in the x axis direction and the y axis direction by an electric field applied to the Pockels cell may be represented by Equation 1 below.

$$\frac{1}{n_x^2} = \frac{1}{n_o^2} + r_{63}E_z \Rightarrow n_x \approx n_o - \frac{1}{2}n_o^3 r_{63}E_z \quad \text{[Equation 1]}$$

$$\frac{1}{n_y^2} = \frac{1}{n_o^2} + r_{63}E_z \Rightarrow n_y \approx n_o - \frac{1}{2}n_o^3 r_{63}E_z$$

With reference to Equation 1, $n_x$ indicates a refractive index changed in the x axis direction, $n_y$ indicates a refractive index changed in the y axis direction, $n_0$ indicates a general refractive index of a Pockels cell, $E_z$ indicates an applied electric field, and $r_{63}$ indicates a linear electro-optical coefficient.

Such birefringence may generate a phase difference ($\Gamma$) of horizontal and vertical polarization components. As shown in Equation 1, nx and ny may be approximated, and when $r_{63}*E_z$ is less than $1/n_0^2$, the phase difference may be represented by Equation 2 below.

$$\Gamma = (n_y - n_x)\frac{2\pi L}{\lambda_{laser}} = \pi \frac{2n_o^3 r_{63}}{\lambda_{laser}} E_z L = \pi \frac{V}{V_\pi} \quad \text{[Equation 2]}$$

With reference to Equation 2, $\Gamma$ indicates a phase difference, $n_x$ indicates a refractive index changed in the x axis direction, $n_y$ indicates a refractive index changed in the y axis direction, $n_0$ indicates a general refractive index of a Pockels cell, $E_z$ indicates an applied electric field, $r_{63}$ indicates a linear electro-optical coefficient, L indicates a length of a Pockels cell, $\lambda_{laser}$ indicates a wavelength of a laser, and $V_\pi$ indicates a half-wavelength voltage of a Pockels cell. According to an embodiment of the present disclosure, $V_\pi$ may be determined based on at least one of a type of Pockels cell, size of Pockels cell, temperature of Pockels cell, and length of laser wavelength, or may be determined to have a value predefined according to user setting.

Figure 3:
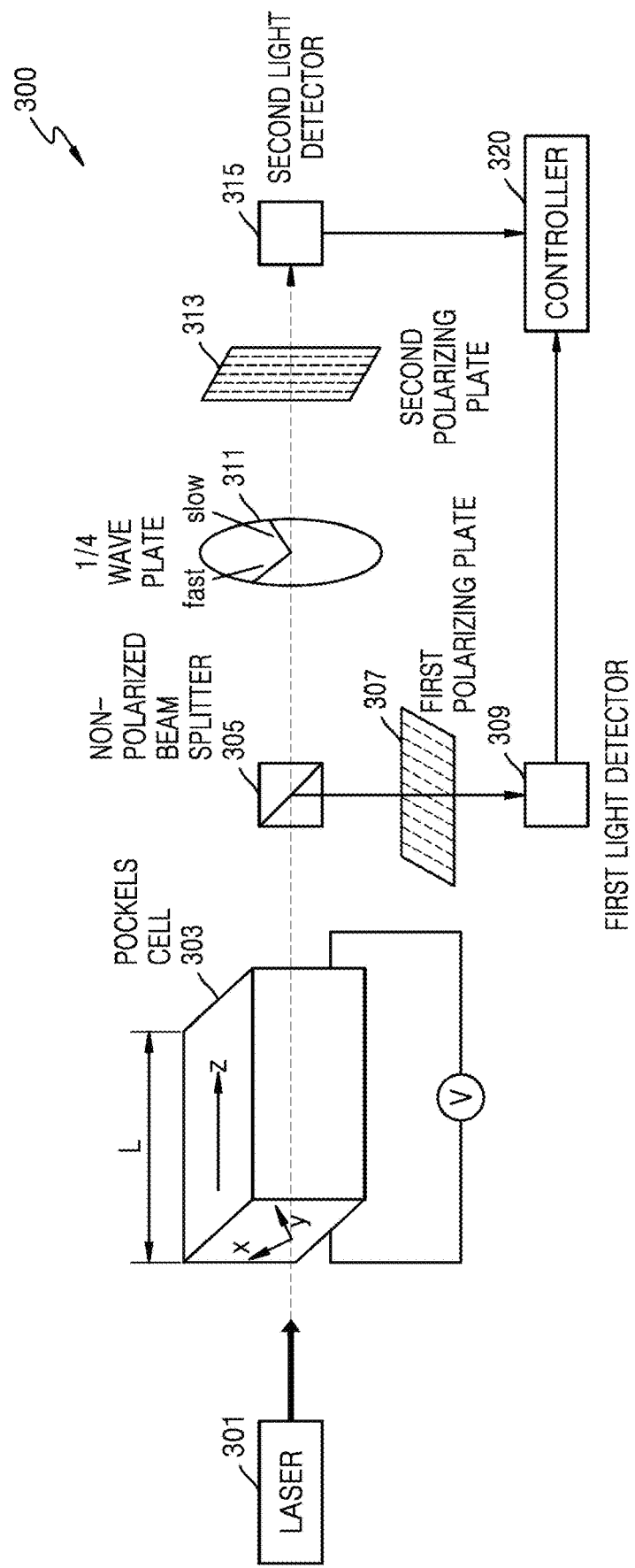
FIG. 3 is a diagram of a voltage measuring system using a Pockels cell, according to various embodiments of the present disclosure.

FIG. 3 is a diagram of a voltage measuring system 300 using a Pockels cell, according to various embodiments of the present disclosure. A voltage measuring system using a Pockels sell may include a laser 301, a Pockels cell 303, a non-polarized beam splitter (NBS) 305, a first polarizing plate 307, a first light detector 309, a ¼ wave plate 311, a second polarizing plate 313, and a second light detector 315.

With reference to FIG. 3, a voltage measuring device using a Pockels cell may include an optical system arrangement modified to be capable of interpreting a signal through polar coordinates. The voltage measuring device may measure a voltage by measuring changes in the horizontal polarization axis and the vertical polarization axis of the laser based on changes voltage applied to the Pockels cell.

Output light of the laser may be input to the Pockels cell 303 and split by the NBS 305. A first beam split by the NBS 305 may pass through the first polarizing plate 307 and be input to the first light detector 309, and a second beam split by the NBS 305 may pass through the ¼ wave plate 311 and the second polarizing plate 313 and be input to the second light detector 315.

With reference to FIG. 3, the laser 301 may output light to the Pockels cell 303. The laser 301 may output a beam used to measure changes in refractive index when a voltage is applied to the Pockels cell. According to an embodiment of the present disclosure, although it is not shown in FIG. 3, a NBS may be further arranged between the laser 301 and the Pockels cell 303. The laser beam may be split into a beam incident onto a third light detector detecting power of the laser and a beam incident onto the Pockels cell by the NBS.

The Pockels cell 303 may output elliptically polarized light by applying to the input light different refractive indexes in relation to the x axis and the y axis. According to an embodiment of the present disclosure, the light which has passed through the Pockels cell may be input to the NBS 305.

The NBS 305 may perform the function of splitting polarized light by the electric field effect. According to an embodiment of the present disclosure, a first laser beam may be split into a first beam passing through only the first polarizing plate 307 and a second beam passing through the ¼ wave plate 311 and the second polarizing plate 313 by the NBS 305. The first beam may be detected by the first light detector 309, and the second beam may be detected by the second light detector 315.

According to an embodiment of the present disclosure, the first light detector 309 may perform the function of monitoring a laser power to compensate for fluctuation of laser power, and the second light detector 315 may perform the function of measuring a phase difference. The voltage measuring device may measure a voltage based on a light intensity T1 measured by the first light detector 309 and a light intensity T2 measured by the second light detector 315. According to an embodiment of the present invention, the controller included in the voltage measuring device may measure a voltage by using a method of comparing T1 and T2 and reverse-estimating an electric field applied to the Pockels cell 303.

Figure 4:
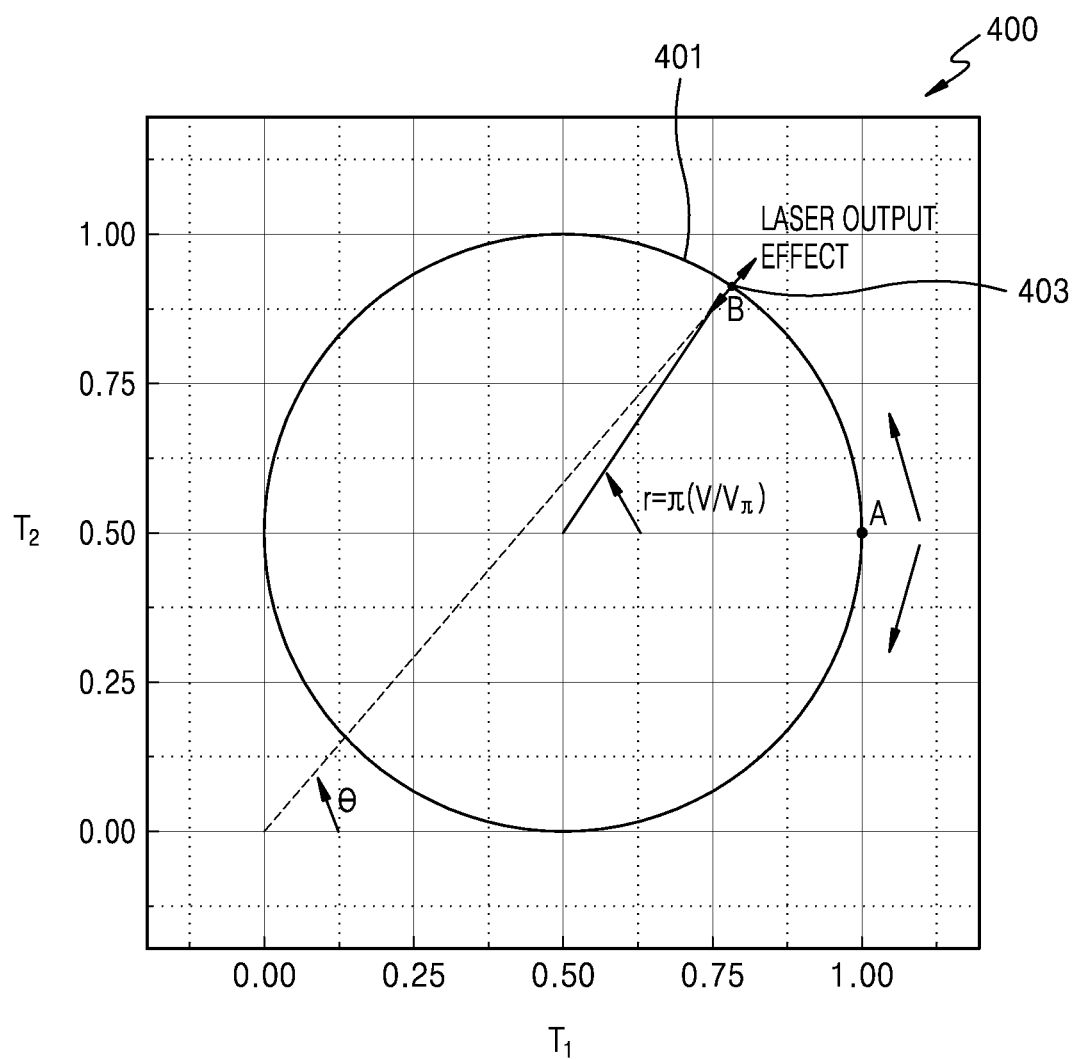
FIG. 4 is a graph showing polar coordinates of a signal measured by a voltage measuring device, according to various embodiments of the present disclosure.

FIG. 4 is a graph 400 showing polar coordinates of a signal measured by a voltage measuring device, according to various embodiments of the present disclosure. In FIG. 4, the horizontal axis indicates the first light intensity T1 measured by the first light detector 309 of FIG. 3, and the vertical axis indicates the second light intensity T2 measured by the second light detector 315 of FIG. 3.

The first intensity measured by the first light detector and the second light intensity measured by the second light detector may be represented by Equation 3 below.

$$T_1 = \frac{1}{2}(1 + \cos \Gamma)$$ [Equation 3]

$$T_2 = \frac{1}{2}(1 + \sin \Gamma)$$

With reference to Equation 3, T1 indicates a light intensity measured by the first light detector, T2 indicates a light intensity measured by the second light detector, and Γ indicates a phase difference.

With reference to FIG. 4, when the voltage measuring device measures an ideal voltage of the Pockels cell without considering an error, the light intensity may be expressed as a circular data curve 401. According to an embodiment of the present disclosure, T1 and T2 may be expressed as a circular graph having (0.5, 0.5) as the origin point and a radius of 0.5 in the polar coordinate system. According to an embodiment of the present disclosure, when the Pockels cell voltage to be measured is V=0, (T1, T2) may be mapped at coordinate A (1, 0.5).

According to an embodiment of the present disclosure, the voltage measuring device may determine a relation regarding T1 and T2 under an ideal condition to determine errors of T1 and T2. According to an embodiment of the present disclosure, the controller 320 included in the voltage measuring device may determine a T1 relation indicating a relationship between the first light intensity and a phase difference and a T2 relation indicating a relationship between the second light intensity and a phase difference, and measure a voltage based on the determined T1 and T2 relations.

With reference to FIG. 4, when the voltage measuring device measures a Pockels cell voltage considering errors of a signal waveform related to fluctuation of laser power, the voltage measuring device may obtain data about scattered points 403 by using the first light detector and the second light detector.

When the detected light intensity is expressed as polar coordinates when there is an error of a signal waveform related to the laser power fluctuation, signal distortion may occur in the θ axis direction from the ideal circular data curve. That is, the laser power fluctuation may cause a change in the radius of the circle having its center at (0.5, 0.5). According to an embodiment of the present disclosure, the voltage measuring device may measure a value including the scattered points 403 according to laser power effects. In response to this, the voltage measuring device may compare the scattered points 403 and the ideal circular data curve 401 to identify a difference from the ideal light intensity. According to an embodiment of the present disclosure, when a signal distorted in the θ axis direction is detected, the voltage measuring device may identify an intersection between the scattered points 403 and the ideal circular data curve 401 and further, the intersection coordinates B. The voltage measuring device may use the intersection coordinates B to identify the phase difference, and then determine and correct an error of the Pockels cell voltage.

Figure 5:
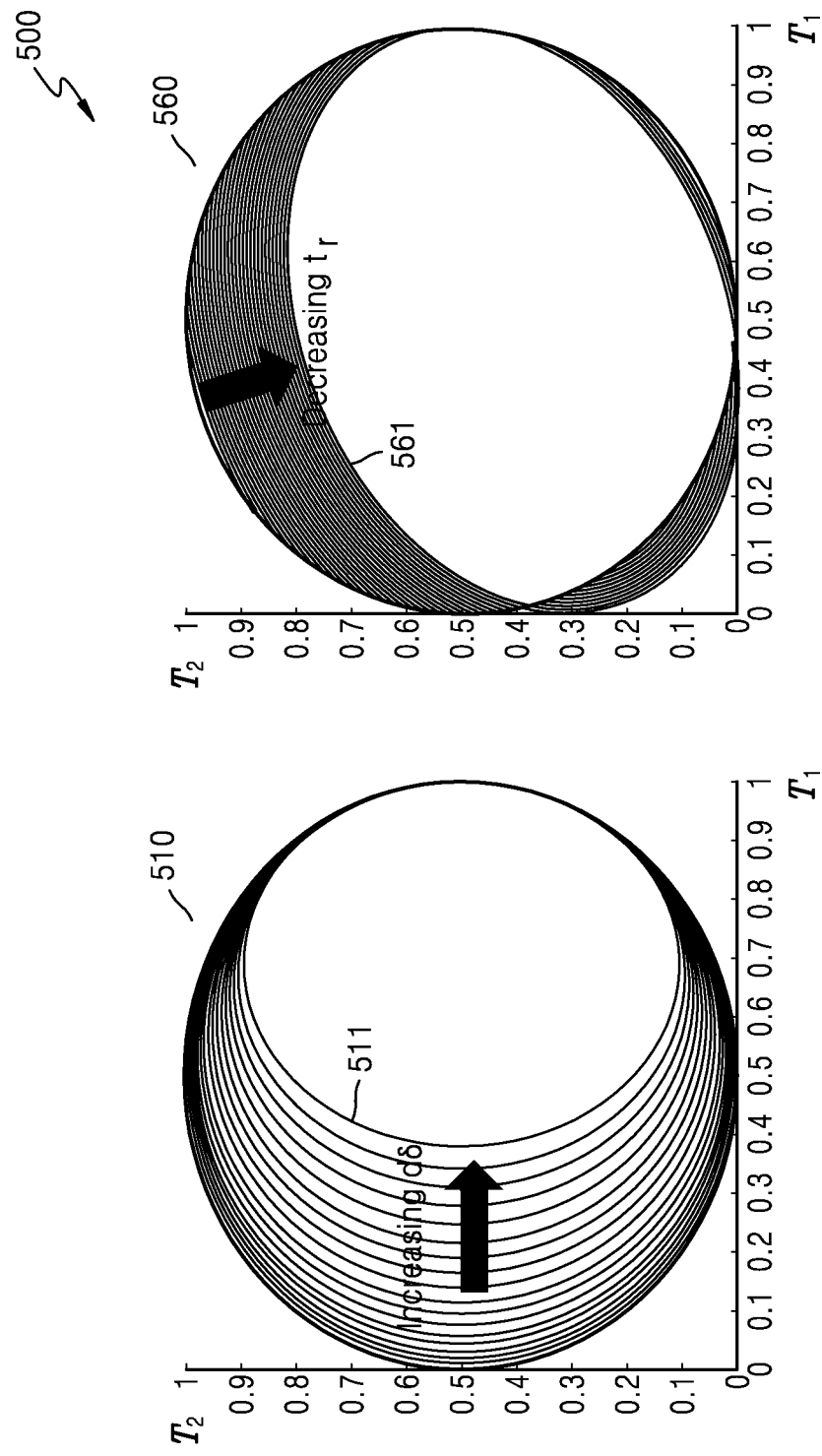
FIG. 5 is a graph showing distortion of a voltage measuring signal according to characteristics and alignment error of an optical system, according to various embodiments of the present disclosure.

FIG. 5 is a graph 500 showing distortion of a voltage measuring signal according to characteristics and alignment error of an optical system, according to various embodiments of the present disclosure. In FIG. 5, the horizontal axis indicates the first light intensity T1 measured by the first light detector 309 of FIG. 3, and the vertical axis indicates the second light intensity T2 measured by the second light detector 315 of FIG. 3.

With reference to FIG. 5, when the voltage measuring device measures an ideal Pockels cell voltage without considering an error, the first light intensity measured by the first light detector and the second light intensity measured by the second light detector may be expressed as a circular data curve.

The left graph 510 in FIG. 5 shows an example of changes in light intensity according to alignment error. With reference to the left graph 510 in FIG. 5, in the process of configuring the voltage measuring device, an alignment error dδ may occur in relation to the polarization axis of the Pockels cell and the polarization axis of the laser. The voltage measuring device may determine and correct the light intensity considering the alignment error related to the polarization axis of the Pockels cell and the polarization axis of the laser, and further correct the error by using the fast Fourier transform (FFT) analysis method.

In measuring a voltage by the voltage measuring device, when there is an alignment error, the light intensity may be determined based on Equation 4 below.

$$T_1^{d\delta} = \frac{1}{2}\left[(1 + \sin^2 2d\delta) + \cos\Gamma\cos^2 2d\delta\right]$$ [Equation 4]

$$T_2^{d\delta} = \frac{1}{2}(1 + \sin\Gamma\cos 2d\delta).$$

With reference to Equation 4, $T_1^{d\delta}$ indicates a first light intensity considering an alignment error, $T_2^{d\delta}$ indicates a second light intensity considering an alignment error, $d\delta$ indicates an alignment error, and F indicates a phase difference.

According to an embodiment of the present disclosure, when the alignment error is 0, Equation 4 may be identical to Equation 3. When the Pockels cell voltage is 0, (T1, T2) may be expressed as (1, 0.5). When the alignment error is not 0, and the voltage measuring device measures the Pockels cell voltage considering an alignment error related to the polarization axis of the Pockels cell and the polarization axis of the laser, the light intensity may be expressed as an elliptical data curve 511. As there is an alignment error, the curve indicating the first and second light intensities expressed as polar coordinates may fall out of the circular data curve by $d\delta$.

According to an embodiment of the present disclosure, the voltage measuring device may obtain an elliptical data curve 511 distorted according to alignment error, based on the first light detector and the second light detector.

The voltage measuring device may compare the elliptical data curve 511 and the ideal light intensity to identify an error. According to an embodiment of the present disclosure, the voltage measuring device may identify a difference in light intensities expressed in the elliptical data curve and the ideal circular data curve and determine an alignment error value according to light intensity difference. The voltage measuring device may identify the phase difference based on the measured alignment error value and Equation 4, and then determine and correct an error of the Pockels cell voltage.

The right graph 560 in FIG. 5 shows an example of changes in light intensity according to polarization transmittance ratio ($t_r = t_{horizontal}/t_{vertical}$) of the NBS. In the case of an ideal NBS, the horizontal polarization transmittance and the vertical polarization transmittance of the laser may be identical to each other ($t_r = 1$). However, in the process of configuring the voltage measuring device, the horizontal polarization transmittance and the vertical polarization transmittance of the NBS may become different from each other. As illustrated in the right graph 560 in FIG. 5, the transmittance ratio may not affect a detection signal of the first light detector detecting light which has not passed through the ¼ wave plate, but may affect a detection signal of the second light detector detecting light which passes through the ¼ wave plate. Accordingly, in relation to the second light intensity, an error based on the transmittance ratio may occur. When there is an error related to the transmittance ratio, the voltage measuring device may determine the light intensity by considering the ratio between the horizontal polarization transmittance and the vertical polarization transmittance of the NBS. When there is an error related to the transmittance ratio, the light intensity measured by the second light detector may be determined based on Equation 5 below.

$$T_2^{t_r} = \frac{1}{4}(1 + t_r^2)\left[1 + \sin\left(\Gamma + \sin^{-1}\frac{1-t_r^2}{1+t_r^2}\right)\right]$$ [Equation 5]

With reference to Equation 5, $T_2^{t_r}$ indicates a second light intensity considering a transmittance ratio, and $t_r$ indicates a ratio between a vertical polarization transmittance of laser and a horizontal polarization transmittance of laser of the NBS.

According to an embodiment of the present disclosure, when tr is 1, Equation 5 may be identical to Equation 3. When tr is not 1, and the voltage measuring device measures the Pockels cell voltage considering an error related to the transmittance ratio, the light intensity may be expressed as an elliptical data curve 561. As there is an error related to the transmittance ratio, the curve indicating the second intensity expressed as polar coordinates may be distorted by tr from the circular data curve.

According to an embodiment of the present disclosure, the voltage measuring device may obtain an elliptical data curve 561 distorted according to alignment error, based on the first light detector and the second light detector. The voltage measuring device may compare the elliptical data curve 561 and the ideal light intensity to identify an error. According to an embodiment of the present disclosure, the voltage measuring device may identify a difference in light intensities expressed in the elliptical data curve and the ideal circular data curve and determine an error value related to the transmittance ratio according to light intensity difference. The voltage measuring device may identify the phase difference based on the measured alignment error value and Equation 5, and then determine and correct an error of the Pockels cell voltage.

Figure 6:
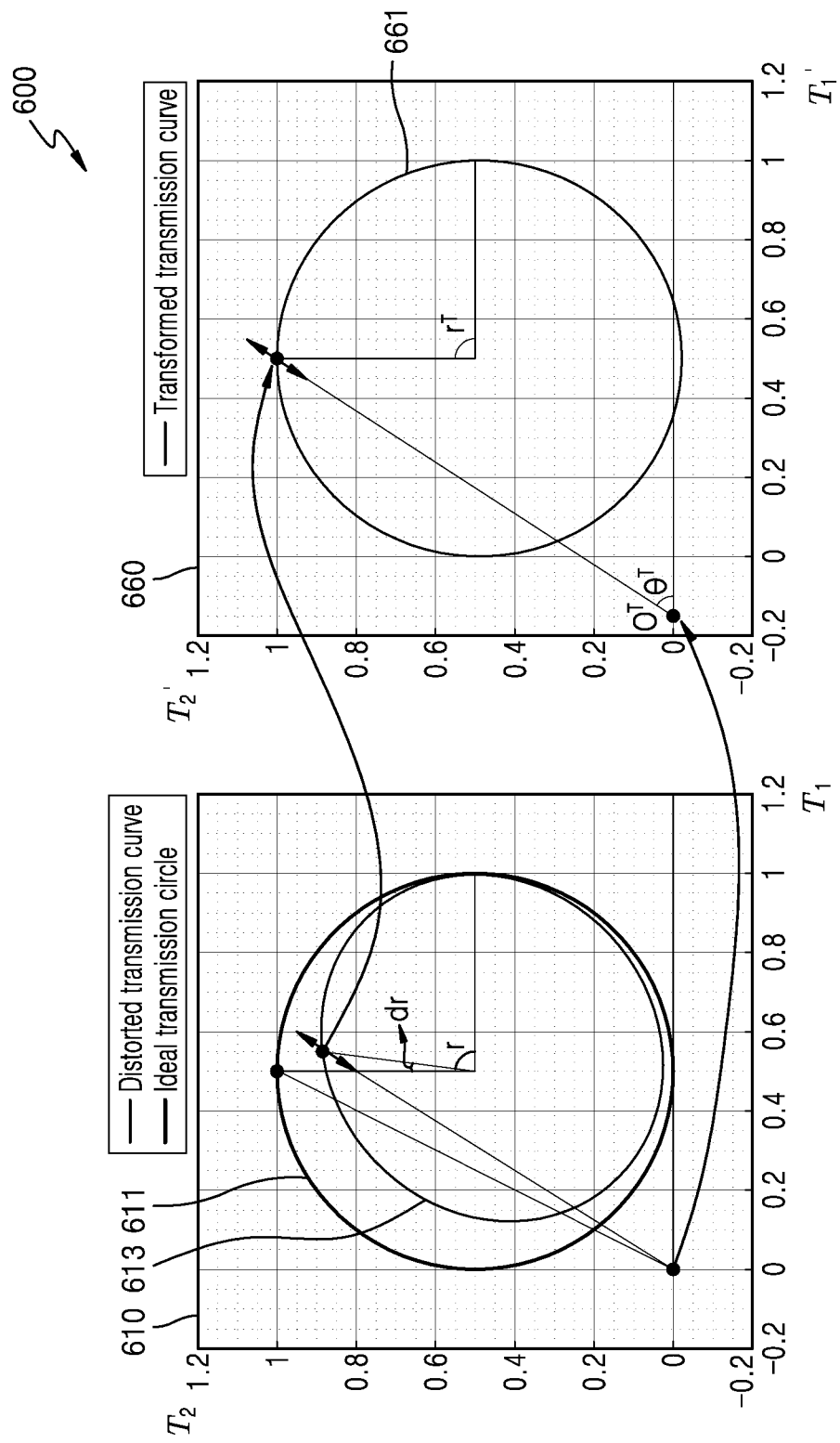
FIG. 6 is a graph showing a method of correcting distortion of a voltage measuring signal according to characteristics and alignment error of an optical system, according to various embodiments of the present disclosure.

FIG. 6 is a graph 600 showing a method of correcting distortion of a voltage measuring signal according to characteristics and alignment error of an optical system, according to various embodiments of the present disclosure. In FIG. 6, the horizontal axis indicates the first light intensity T1 measured by the first light detector 309 of FIG. 3, and the vertical axis indicates the second light intensity T2 measured by the second light detector 315 of FIG. 3.

With reference to FIG. 6, when the voltage measuring device measures an ideal Pockels cell voltage without considering an error, the first light intensity measured by the first light detector and the second light intensity measured by the second light detector may be expressed as a circular data curve 611.

The left graph 610 in FIG. 6 shows an example of changes in light intensity considering both of an alignment error and an error related to a transmittance ratio. With reference to the left graph 610 in FIG. 6, in the process of configuring the voltage measuring device, an alignment error $d\delta$ related to the polarization axis of the Pockels cell and the polarization axis of the laser and an error related to a polarization transmittance ratio of the NBS may occur. The voltage measuring device may determine and correct the light intensity considering both of the alignment error and the error related to the transmittance ratio. In measuring a voltage by the voltage measuring device, when there is an alignment error and an error related to the transmittance ratio, the light intensity may be determined based on Equation 6 below.

$$T_1^{exp} = \frac{1}{2}\left[(1 + \sin^2 2d\delta) + \cos\Gamma\cos^2 2d\delta\right],$$ [Equation 6]

$$T_2^{exp} = \frac{1}{2}\left[\frac{1}{2}(1 + \sin^2 2d\delta + t_r^2\cos^2 2d\delta) + \frac{1}{2}(1 - t_r^2)\cos\Gamma\cos^2 2d\delta + t_r\sin\Gamma\cos 2d\delta\right]$$

With reference to Equation 6, $T_1^{exp}$ indicates a first light intensity considering an alignment error and an error related to a transmittance ratio, $T_2^{exp}$ indicates a second light intensity considering an alignment error and an error related to a transmittance ratio, dδ indicates an alignment error, tr indicates a transmittance ratio, and Γ indicates a phase difference.

According to an embodiment of the present disclosure, the alignment error and the transmittance ratio may include values determined according to user setting, values determined in the process of configuring the voltage measuring device, and values determined based on statistics according to multiple measurements. According to an embodiment of the present disclosure, when the voltage measuring device measures a Pockels cell considering an alignment error and transmittance ratio when the alignment error is not 0, and the transmittance ratio is not 1, the light intensity may be expressed as an elliptical data curve 613. According to an embodiment of the present disclosure, the voltage measuring device may obtain an elliptical data curve 613 distorted according to alignment error, based on the first light detector and the second light detector.

The voltage measuring device may compare the elliptical data curve 613 and the ideal light intensity to identify an error. According to an embodiment of the present disclosure, the voltage measuring device may identify a difference in light intensities expressed in the elliptical data curve and the ideal circular data curve and determine an error value according to light intensity difference. The error related to light intensity difference may be determined based on a method of moving the origin point of the right graph 610 of FIG. 6. The voltage measuring device may identify the phase difference based on the measured error value and Equation 6, and then determine and correct an error of the Pockels cell voltage. The voltage measuring device may obtain a result value of a circular data curve 661 axis-transformed from a right graph 660 in FIG. 6.

Figure 7:
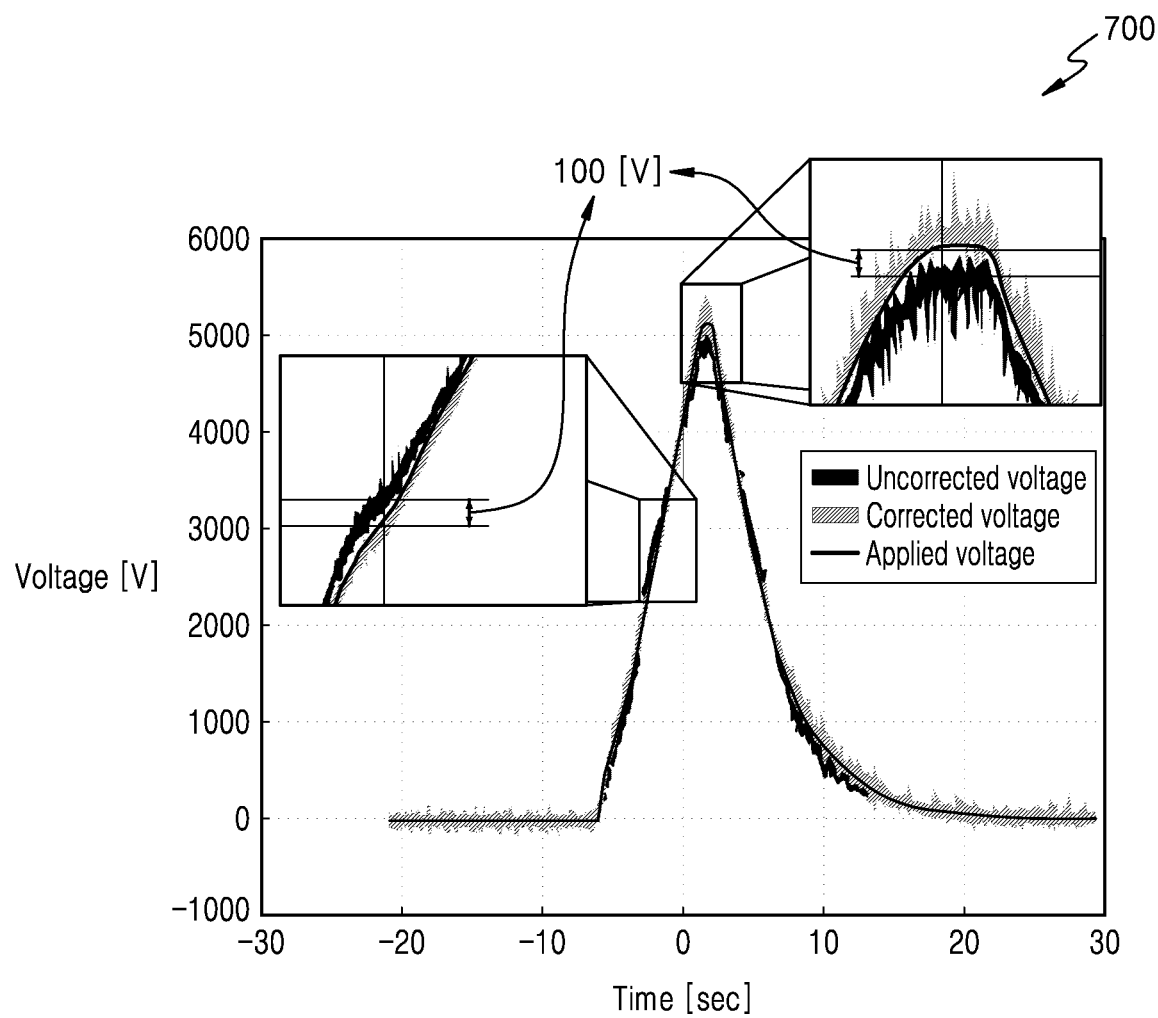
FIG. 7 is a graph showing results of measuring a voltage by a voltage measuring device using a Pockels cell, according to various embodiments of the present disclosure.

FIG. 7 is a graph 700 showing results of measuring a voltage by a voltage measuring device using a Pockels cell, according to various embodiments of the present disclosure. In FIG. 7, the horizontal axis indicates time, and the vertical axis indicates voltage. FIG. 7 is a graph showing uncorrected voltage, corrected voltage, and applied voltage.

FIG. 7 illustrates an example in which the alignment error dδ and tr are experimentally determined as 4 and 0.9, respectively. With reference to FIG. 7, a voltage on which correction of alignment error and error related to transmittance ratio is performed has a value closer to an actual value, compared to a voltage without any correction.

With reference to FIG. 7, the voltage measuring device may measure a voltage in a voltage range of $(-V\pi, V\pi)$, which is wider than $(0, V\pi)$. When the voltage changes over time, the change of voltage may have continuity according to time. Generally, the change of voltage over time may have a value of nanosecond, and response speed of the Pockels cell may have a value of femtosecond to picosecond. Accordingly, the speed of voltage change according to time may be lower than the response speed of the voltage measuring device using the Pockels cell. Therefore, when a bandwidth of a system measuring a signal waveform of the voltage measuring device can measure voltage changes, the voltage measuring device may use the time-tracking method to extend the measuring range to a breakdown voltage of the Pockels cell ($V_B$, or breakdown field $E_B$).

When the voltage increases for a time (t+a), the waveform of the signal may move in the counterclockwise direction at a time t, and when the voltage decreases, the waveform of the signal may move in the clockwise direction at the time t. When the voltage measuring device recognizes the position of the signal at the time t, the increase or decrease of voltage at the time (t+a) may also be identified. According to an embodiment of the present disclosure, when the measurement signal at the time (t+a) is (T1, T2)=(1.0, 0.5), the voltage thereof may be expected to be 0, $\pm nV\pi$ (n is a constant). In this case, when the voltage measuring device recognizes the position of voltage signal and the level of voltage at the time t, the voltage at the time (t+a) may be determined.

According to an embodiment of the present disclosure, errors due to the power of laser, the transmittance of optical system, and the alignment effect in the voltage measuring device may be measured and corrected. Moreover, according to an embodiment of the present disclosure, the voltage measurement range of the voltage measuring device may be extended from $-V\pi$ to $V\pi$. When the voltage changes over time (e.g., AC voltage), the measurement range may be unlimitedly extended by the time-tracking method.

Figure 8:
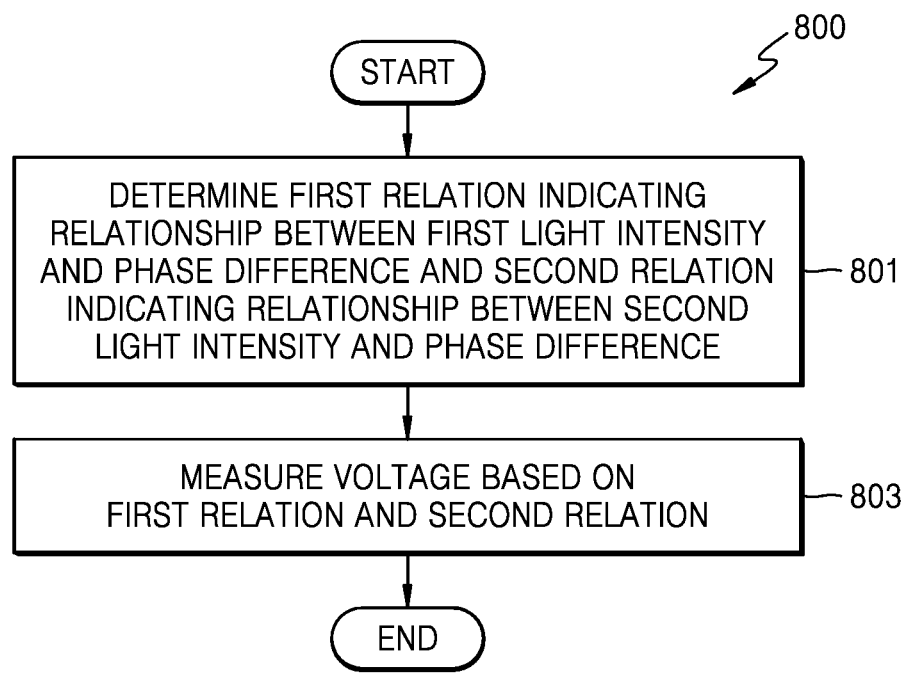
FIG. 8 is a flowchart showing a method of operating a voltage measuring device using a Pockels cell, according to various embodiments of the present disclosure.

FIG. 8 is a flowchart 800 showing a method of operating a voltage measuring device using a Pockels cell, according to various embodiments of the present disclosure.

With reference to FIG. 8, in operation 801, the voltage measuring device may determine a first relation indicating a relationship between a first light intensity and a phase difference and a second relation indicating a relationship between a second light intensity and a phase difference. The voltage measuring device may determine the first relation and the second relation, which serve as a reference, to determine an error of a voltage. According to an embodiment of the present disclosure, the first light intensity indicates an intensity of light which has passed through the Pockels cell and has been polarized based on a first polarizing plate, and then detected by a first light detector, and the second light intensity indicates an intensity of light which has passed through the Pockels cell and has been polarized based on a second polarizing plate and a ¼ wave plate, and then detected by a second light detector.

In operation 803, the voltage measuring device may measure a voltage based on the first relation and the second relation. The voltage measuring device may identify and correct an error of measure voltage by using the reference of first and second relations. According to an embodiment of the present disclosure, when a voltage changes overtime, the controller may control a measuring range of the voltage to be greater than a half-wavelength voltage range of the Pockels cell, based on a time-tracking method.

Figure 9:
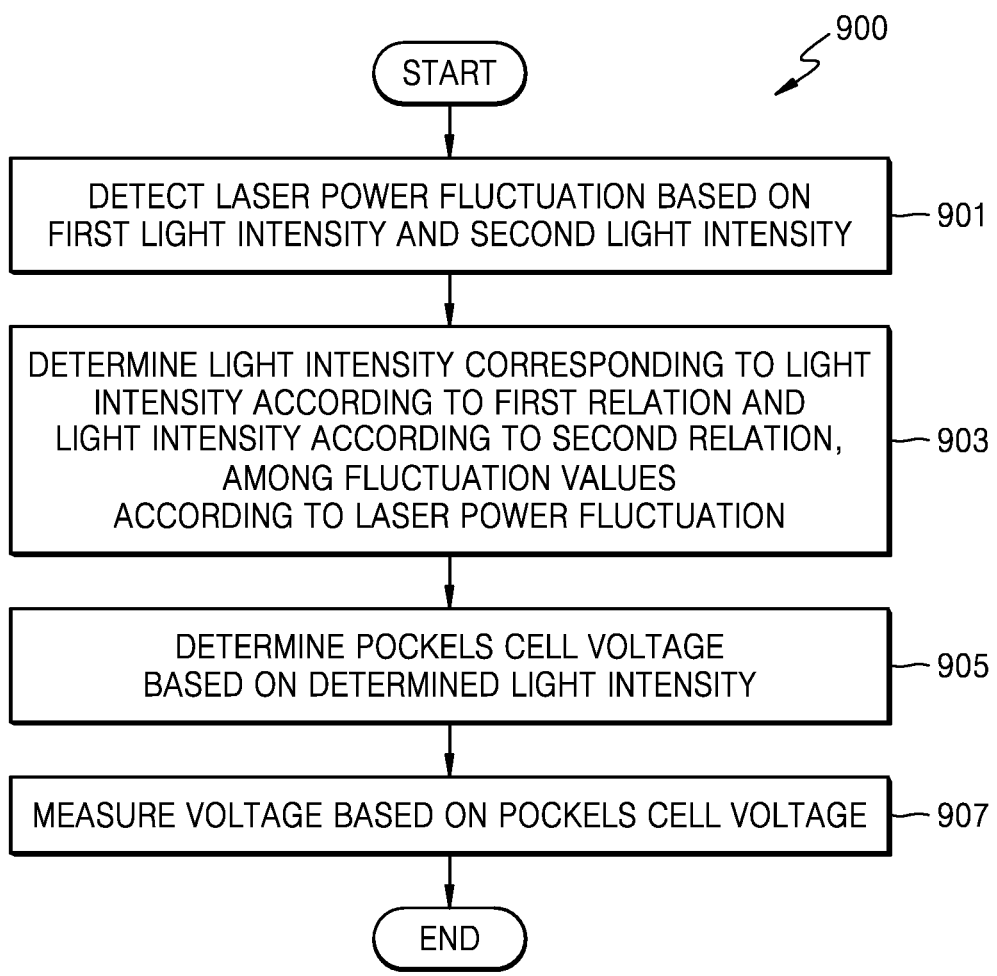
FIG. 9 is a flowchart showing a method of operating a voltage measuring device using a Pockels cell in consideration of laser power fluctuation, according to various embodiments of the present disclosure.

FIG. 9 is a flowchart 900 showing a method of operating a voltage measuring device using a Pockels cell in consideration of laser power fluctuation, according to various embodiments of the present disclosure.

With reference to FIG. 9, in operation 901, the voltage measuring device may detect laser power fluctuation based on the first light intensity and the second light intensity. According to an embodiment of the present disclosure, when the detected light intensity is expressed as polar coordinates when there is an error of a signal waveform related to the laser power fluctuation, signal distortion may occur in the θ axis direction from the ideal circular data curve. According to an embodiment of the present disclosure, the voltage measuring device may measure intensity values of light including the scattered points according to laser power effects.

In operation 903, the voltage measuring device may determine, among fluctuation values according to the laser power fluctuation, a light intensity corresponding to a light intensity according to the first relation and a light intensity according to the second relation. According to an embodiment of the present disclosure, the voltage measuring device may compare the detected light intensity values with the light intensities determined according to the first relation and the second relation to determine an error. According to an embodiment of the present disclosure, the voltage measuring device may identify a point included in the light intensity value according to the first relation and the second relation, among the detected light intensity values.

In operation 905, the voltage measuring device may determine the Pockels cell voltage based on the determined light intensity, and in operation 907, the voltage measuring device may measure a voltage based on the Pockels cell voltage. According to an embodiment of the present disclosure, the voltage measuring device may identify a phase difference by using the detected light intensity in operation 903 and perform correction on the voltage by using the Pockels cell voltage.

Figure 10:
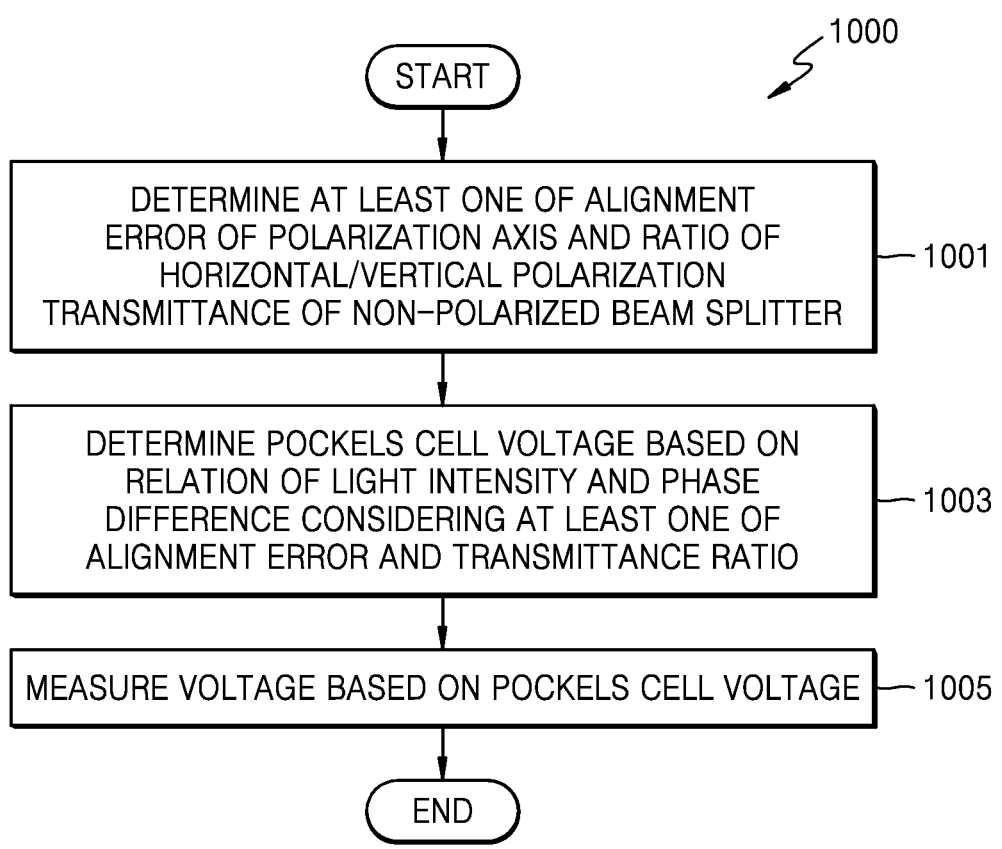
FIG. 10 is a flowchart showing a method of operating a voltage measuring device using a Pockels cell in consideration of alignment error and transmittance ratio, according to various embodiments of the present disclosure.

FIG. 10 is a flowchart 1000 showing a method of operating a voltage measuring device using a Pockels cell in consideration of alignment error and transmittance ratio, according to various embodiments of the present disclosure.

With reference to FIG. 10, in operation 1001, the voltage measuring device may determine at least one of an alignment error of a polarization axis and a ratio between horizontal and vertical transmittances of the NBS. According to an embodiment of the present disclosure, the alignment error and the transmittance ratio may include values determined according to user setting, values determined in the process of configuring the voltage measuring device, and values determined based on statistics according to multiple measurements.

In operation 1003, the voltage measuring device may measure the Pockels cell voltage based on a relation between a light intensity considering at least one of an alignment error and a transmittance ratio, and a phase difference. The voltage measuring device may identify a phase difference based on at least one of relations considering an alignment error, relations considering a transmittance ratio, and relations considering both of an alignment error and a transmittance ratio.

According to an embodiment of the present disclosure, the voltage measuring device may obtain distorted data considering at least one of an alignment error and a transmittance ratio based on the light intensities measured by the first light detector and the second light detector. The voltage measuring device may compare the distorted data curve with the light intensities determined in the first relation and the second relation to determine an error.

In operation 1005, the voltage measuring device may measure a voltage based on the Pockels cell voltage.

According to an embodiment of the present disclosure, the voltage measuring device may perform correction of voltage by using the Pockels cell voltage determined in operation 1003.

According to an embodiment of the present disclosure, an optic-based voltage measuring device using a Pockels cell may reduce errors in comparison with existing voltage measuring devices, and may measure a voltage in an extended measurement range.

An error may be present in the power of a laser used in the optic-based voltage measuring device, and the drift effect may occur according to operation time. Changes in laser power during the time of measuring a voltage by the voltage measuring device may cause errors in a voltage measured by the optic-based voltage measuring device. Accordingly, the voltage measuring device according to the present disclosure may reduce errors based on a signal processing method of correcting distortion of voltage signals caused by changes in laser power.

In small-sized sensors other than large-sized optical systems, due to a gap between a housing and an optical system, fixed integrated configuration, unavailable constant adjustment, etc., the optical system may not be completely aligned. Unstable optical system alignment may cause distortion of signal patterns of the voltage measuring device and a problem in the follow-up performance of the optic-based voltage measuring device. The voltage measuring device according to the present disclosure may reduce errors in voltage measurement based on the signal processing method of tracking and correcting distortion of voltage signals caused by alignment state of optical system.

As manufacturing of ideal optical system is practically impossible, the signal patterns measured by the voltage measuring device may be distorted. The voltage measuring device according to the present disclosure may reduce errors in voltage measurement based on the signal processing method of tracking and correcting distortion of voltage signals caused by characteristics of optical system.

According to an embodiment of the present disclosure, the voltage measurement range of the voltage measuring device may be extended from $(0, V\pi)$ to $(-V\pi, V\pi)$. When measuring a voltage that changes over time, the measurement range may be extend to a breakdown voltage $V_B$ of the Pockels cell or a breakdown field $E_B$.

The methods according to the embodiments described in the claims or the specification of the present disclosure may be implemented in the form of a hardware, a software, or a combination thereof.

When the methods are implemented by a software, a computer-readable storage medium storing one or more programs (software modules) may be provided. The one or more programs stored in the computer-readable storage medium may be configured to be executable by at least one processor in an electronic device. The one or more programs may include instructions for executing, by an electronic device, the methods according to the embodiments described in the claims of the specification of the present disclosure.

Such programs (software modules, software) may be stored in a random access memory, a non-volatile memory including a flash memory, a read-only memory (ROM)m an electrically erasable programmable read-only memory (EEPROM), a magnetic disc storage device, a compact disc-ROM (CD-ROM), a digital versatile discs (DVDs), a magnetic cassette, or other types of optical storage devices. Alternatively, the programs may be stored in a combination of some or all of the foregoing. In addition, a plurality of constituent memories may be provided.

Moreover, the programs may be stored in communication network, such as Internet, Intranet, a local area network (LAN), a wide area network (WAN), or a storage area network (SAN), or an attachable storage device accessible through a communication network consisting of a combination of the foregoing. Such a storage device may be connected to a device performing the embodiments of the present disclosure through an external port. Moreover, a separate storage device on a communication network may be connected to a device performing the embodiments of the present disclosure.

In the detailed embodiments of the present disclosure, components included in the disclosure are expressed in singular or plural form according to a specific embodiment suggesting the component. However, the singular or plural forms are properly selected for a suggested circumstance for convenience of description, and the present disclosure is not limited to the singular or plural components. A component described in plural form may include a single component, and a component described in singular form may include multiple components.

The present disclosure describes specific embodiments in detailed description; however, various modifications may be made to the embodiments within the scope of the present disclosure. Therefore, the scope of the present disclosure should not be limited to the described embodiments but should be defined by the scope of claims set forth below and equivalents thereof.

The invention claimed is:

1. A voltage measuring device comprising:
   a Pockels cell whose birefringence varies based on an electric field applied to the Pockels cell, wherein the birefringence generates a phase difference;
   at least one non-polarized beam splitter splitting an incident beam passing through the Pockels cell into a first beam and a second beam;
   a first polarizing plate polarizing the first beam to output a polarized first beam;
   a first light detector detecting the polarized first beam;
   a ¼ wave plate elliptically polarizing the second beam to output an elliptically polarized second beam;
   a second polarizing plate polarizing the elliptically polarized second beam to output a polarized second beam;
   a second light detector detecting the polarized second beam; and
   a controller configured to measure a voltage corresponding to the electric field applied to the Pockels cell, based on a first light intensity determined by the first light detector and a second light intensity determined by the second light detector.

2. The voltage measuring device of claim 1, wherein the controller is further configured to:
   determine a first equation representing a relationship between the first light intensity and the phase difference, and a second equation representing a relationship between the second light intensity and the phase difference;
   determine a phase difference value corresponding to the electric field applied to the Pockels cell, based on the first light intensity, the second light intensity, the first equation, and the second equation; and
   determine the voltage based on the phase difference value and a half-wave voltage of the Pockels cell.

3. The voltage measuring device of claim 2, wherein the controller is further configured to:
   detect laser power fluctuation based on the first light intensity and the second intensity;
   determine, among fluctuation values according to the laser power fluctuation, a light intensity corresponding to a light intensity according to the first equation and a light intensity according to the second equation;
   determine a Pockels cell voltage based on the determined light intensity; and
   measure the voltage based on the Pockels cell voltage.

4. The voltage measuring device of claim 2, wherein, when the voltage increases over time, the controller is further configured to measure the voltage greater than the half-wavelength voltage of the Pockels cell by tracking changes of the phase difference.

5. The voltage measuring device of claim 2, wherein the first equation and the second equation are below:

$$T_1 = \frac{1}{2}(1 + \cos \Gamma)$$

$$T_2 = \frac{1}{2}(1 + \sin \Gamma)$$

where $T_1$ indicates the first light intensity, $T_2$ indicates the second light intensity, and $\Gamma$ indicates the phase difference.

6. The voltage measuring device of claim 1, wherein the controller is further configured to:
   determine an alignment error between a polarization axis of a laser outputting the incident beam to the Pockels cell and a polarization axis of the Pockels cell;
   determine a first equation representing a relationship between the first light intensity, the phase difference, and the determined alignment error;
   determine a second equation representing a relationship between the second light intensity, the phase difference, and the determined alignment error;
   determine a phase difference value corresponding to the electric field applied to the Pockels cell, based on the first light intensity, the second light intensity, the first equation, and the second equation;
   determine a Pockels cell voltage based on the phase difference value and a half-wave voltage of the Pockels cell; and
   measure the voltage based on the Pockels cell voltage.

7. The voltage measuring device of claim 6, wherein the first equation and the second equation are below:

$$T_1^{d\delta} = \frac{1}{2}\left[(1 + \sin^2 2d\delta) + \cos\Gamma \cos^2 2d\delta\right]$$

$$T_2^{d\delta} = \frac{1}{2}(1 + \sin\Gamma \cos 2d\delta)$$

where $T_1^{d\delta}$ indicates the first light intensity, $T_2^{d\delta}$ indicates the second light intensity, $d\delta$ indicates the alignment error, and $\Gamma$ indicates the phase difference.

8. The voltage measuring device of claim 1, wherein the controller is further configured to:
   determine a ratio between a vertical polarization transmittance and a horizontal polarization transmittance of the non-polarized beam splitter;
   determine a first equation representing a relationship between the first light intensity, and the phase difference;
   determine a second equation representing a relationship between the second light intensity, the phase difference, and the determined ratio;
   determine a phase difference value corresponding to the electric field applied to the Pockels cell, based on the first light intensity, the second light intensity, the first equation, and the second equation;
   determine a Pockels cell voltage based on the phase difference value and a half-wave voltage of the Pockels cell; and
   measure the voltage based on the Pockels cell voltage.

9. The voltage measuring device of claim 8, wherein the first equation and the second equation are below:

$$T_1 = \frac{1}{2}(1 + \cos\Gamma)$$

$$T_2^{tr} = \frac{1}{4}(1 + t_r^2)\left[1 + \sin\left(\Gamma + \sin^{-1}\frac{1 - t_r^2}{1 + t_r^2}\right)\right]$$

where $T_1$ indicates the first light intensity, $T_2^{tr}$ indicates the second light intensity, $t_r$ indicates the ratio, and $\Gamma$ indicates the phase difference.

10. The voltage measuring device of claim 1, wherein the controller is further configured to:
   determine an alignment error between a polarization axis of a laser outputting the incident beam to the Pockels cell and a polarization axis of the Pockels cell;
   determine a ratio between a vertical polarization transmittance and a horizontal polarization transmittance of the non-polarized beam splitter;
   determine a first equation representing a relationship between the first light intensity, the phase difference, and the determined alignment error;
   determine a second equation representing a relationship between the second light intensity, the phase difference, the determined alignment error, and the determined ratio;
   determine a phase difference value corresponding to the electric field applied to the Pockels cell, based on the first light intensity, the second light intensity, the first equation, and the second equation;
   determine a Pockels cell voltage based on the phase difference value and a half-wave voltage of the Pockels cell; and
   measure the voltage based on the Pockels cell voltage.

11. The voltage measuring device of claim 10, wherein the first light detector measures first light intensities over multiple times,
   the second light detector measures second light intensities over multiple times, and
   the alignment error and the ratio are determined based on statistical values of the first light intensities and the second light intensities.

12. The voltage measuring device of claim 10, wherein the first equation and the second equation are below:

$$T_1^{exp} = \frac{1}{2}\left[(1 + \sin^2 2d\delta) + \cos\Gamma\cos^2 2d\delta\right]$$

$$T_2^{exp} = \frac{1}{2}\left[\frac{1}{2}(1 + \sin^2 2d\delta + t_r^2\cos^2 2d\delta) + \frac{1}{2}(1 - t_r^2)\cos\Gamma\cos^2 2d\delta + t_r\sin\Gamma\cos 2d\delta\right]$$

where $T_1^{exp}$ indicates the first light intensity, $T_2^{exp}$ indicates the second light intensity, $d\delta$ indicates the alignment error, tr indicates the ratio, and $\Gamma$ indicates the phase difference.

13. A method of measuring a voltage applied to a Pockels cell based on an intensity of light passing through the Pockels cell whose birefringence varies depending on the voltage, the birefringence generating a phase difference, the method comprising:
   determining a first equation indicating a relationship between a first light intensity and the phase difference and a second equation indicating a relationship between a second light intensity and the phase difference; and
   measuring the voltage based on the first equation and the second equation,
   wherein the first light intensity indicates an intensity of light which has passed through the Pockels cell and has been polarized based on a first polarizing plate, and detected by a first light detector, and
   the second light intensity indicates an intensity of light which has passed through the Pockels cell and has been polarized based on a second polarizing plate and a ¼ wave plate, and detected by a second light detector.

14. The method of claim 13, wherein the measuring of a voltage comprises:
   detecting laser power fluctuation based on the first light intensity and the second intensity;
   determining, among fluctuation values according to the laser power fluctuation, a light intensity corresponding to a light intensity according to the first equation and a light intensity according to the second equation;
   determining a Pockels cell voltage based on the determined light intensity; and
   measuring the voltage based on the Pockels cell voltage.

15. The method of claim 13, wherein the measuring of a voltage comprises:
   determining an alignment error between a polarization axis of a laser outputting the incident beam to the Pockels cell and a polarization axis of the Pockels cell;
   determining a first equation representing a relationship between the first light intensity, the phase difference, and the determined alignment error;
   determining a second equation representing a relationship between the second light intensity, the phase difference, and the determined alignment error;
   determining a phase difference value corresponding to the electric field applied to the Pockels cell, based on the first light intensity, the second light intensity, the first equation, and the second equation;
   determining a Pockels cell voltage based on the phase difference value and a half-wave voltage of the Pockels cell; and
   measuring the voltage based on the Pockels cell voltage.

16. The method of claim 13, wherein the measuring of a voltage comprises:
   determining a ratio between a vertical polarization transmittance and a horizontal polarization transmittance of a non-polarized beam splitter;
   determining a first equation representing a relationship between the first light intensity, and the phase difference;
   determining a second equation representing a relationship between the second light intensity, the phase difference, and the determined ratio;
   determining a phase difference value corresponding to the electric field applied to the Pockels cell, based on the first light intensity, the second light intensity, the first equation, and the second equation;
   determining a Pockels cell voltage based on the phase difference value and a half-wave voltage of the Pockels cell; and
   measuring the voltage based on the Pockels cell voltage.

17. The method of claim 13, wherein the measuring of a voltage comprises:
   determining an alignment error between a polarization axis of a laser outputting the incident beam to the Pockels cell and a polarization axis of the Pockels cell;

determining a ratio between a vertical polarization transmittance and a horizontal polarization transmittance of a non-polarized beam splitter;

determining a first equation representing a relationship between the first light intensity, the phase difference, and the determined alignment error;

determining a second equation representing a relationship between the second light intensity, the phase difference, the determined alignment error, and the determined ratio;

determining a phase difference value corresponding to the electric field applied to the Pockels cell, based on the first light intensity, the second light intensity, the first equation, and the second equation;

determining a Pockels cell voltage based on the phase difference value and a half-wave voltage of the Pockels cell; and measuring the voltage based on the Pockels cell voltage.

* * * * *